(12) United States Patent  (10) Patent No.: US 7,479,692 B2
Dimaano, Jr. et al.  (45) Date of Patent: Jan. 20, 2009

(54) INTEGRATED CIRCUIT PACKAGE SYSTEM WITH HEAT SINK

(75) Inventors: Antonio B. Dimaano, Jr., Singapore (SG); Il Kwon Shim, Singapore (SG); Henry D. Bathan, Singapore (SG); Jeffrey D. Punzalan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 44 days.

(21) Appl. No.: 11/558,413

(22) Filed: Nov. 9, 2006

(65) Prior Publication Data

US 2008/0111217 A1 May 15, 2008

(51) Int. Cl.
*H01L 23/495* (2006.01)

(52) U.S. Cl. .................. 257/676; 257/675; 257/676; 257/E23.08

(58) Field of Classification Search .................. 257/675, 257/676, E23.08
See application file for complete search history.

(56) References Cited

U.S. PATENT DOCUMENTS

| | | | |
|---|---|---|---|
| 6,437,438 B1 * | 8/2002 | Braasch | 257/712 |
| 7,098,080 B2 | 8/2006 | Takeuchi | |
| 7,100,680 B2 | 9/2006 | Dussinger et al. | |
| 7,105,931 B2 | 9/2006 | Attarwala | |
| 7,109,573 B2 | 9/2006 | Nurminen | |
| 2004/0125568 A1 | 7/2004 | Tao | |
| 2007/0090502 A1 * | 4/2007 | Zhao et al. | 257/675 |
| 2007/0090519 A1 * | 4/2007 | Carter et al. | 257/712 |

FOREIGN PATENT DOCUMENTS

JP 406104346 A * 4/1994

* cited by examiner

*Primary Examiner*—Victor A Mandala
(74) *Attorney, Agent, or Firm*—Mikio Ishimaru

(57) ABSTRACT

An integrated circuit package system is provided including forming a paddle, forming a ring with a recess in the paddle, mounting a device in the recess, forming a slot in the ring, and mounting a heat sink in the slot over the device.

20 Claims, 9 Drawing Sheets

INTEGRATED CIRCUIT PACKAGE SYSTEM WITH HEAT SINK

TECHNICAL FIELD

The present invention relates generally to integrated circuit packages and more particularly to integrated circuit packages with a heat sink.

BACKGROUND ART

Every new generation of integrated circuits with increased operating frequency, performance and the higher level of large scale integration have underscored the need for back-end semiconductor manufacturing to increase the heat management capability within an encapsulated package. It is well acknowledged that when a semiconductor device becomes denser in term of electrical power consumption per unit volume, heat generated is also increases correspondingly. More and more packages are now designed with an external heat sink or heat slug to enhance the ability of heat being dissipated to the package ambient environment. As the state of the art progresses, the ability to adequately dissipate heat is often a constraint on the rising complexity of package architecture design, smaller footprint, higher device operating speed and power consumption.

Modern electronics, such as smart phones, personal digital assistants, location based services devices, enterprise class servers, or enterprise class storage arrays, are packing more integrated circuits into an ever shrinking physical space with expectations for decreasing cost. Contemporary electronics expose integrated circuits and packages to more demanding and sometimes new environmental conditions, such as cold, heat, and humidity requiring integrated circuit packages to provide robust thermal management structures.

As more functions are packed into the integrated circuits and more integrated circuits into the package, more heat is generated degrading the performance, the reliability, and the lifetime of the integrated circuits. As more circuitry is packed into the integrated circuits, the integrated circuit generates more radiated energy called electromagnetic interference (EMI). Unlike heat, EMI should not be dissipated to the environment but its energy should be absorbed by the system back to a ground plane. Another consequence of continued integration, the number of input/output (I/O) may increase to cause increases to the width and length of the integrated circuit package. These increased dimensions make the large integrated circuit package prone to warpage to cause manufacturing, yield, reliability, and functional problems.

Numerous technologies have been developed to meet these requirements. Some of the research and development strategies focus on new package technologies while others focus on improving the existing package technologies. Research and development in the existing package technologies may take a myriad of different directions.

One proven way to reduce cost is to use mature package technologies with existing manufacturing methods and equipments. Paradoxically, the reuse of existing manufacturing processes does not typically result in the reduction of package dimensions. Existing packaging technologies struggle to cost effectively meet the ever-demanding thermal, EMI, and structural requirements of today's integrated circuits and packages.

Most integrated circuit devices use molded plastic epoxy as an epoxy mold compound (EMC) for protecting package. But the poor heat dissipation property of EMC sometimes leads to device malfunctions. Some approaches use external heat sinks but do not help with EMI or warpage problems. Other approaches use internal heat sinks or spreaders but do not mitigate both EMI and warpage problems.

Thus, a need still remains for an integrated circuit package system providing low cost manufacturing and improved yield for the integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a paddle, forming a ring with a recess in the paddle, mounting a device in the recess, forming a slot in the ring, and mounting a heat sink in the slot over the device.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
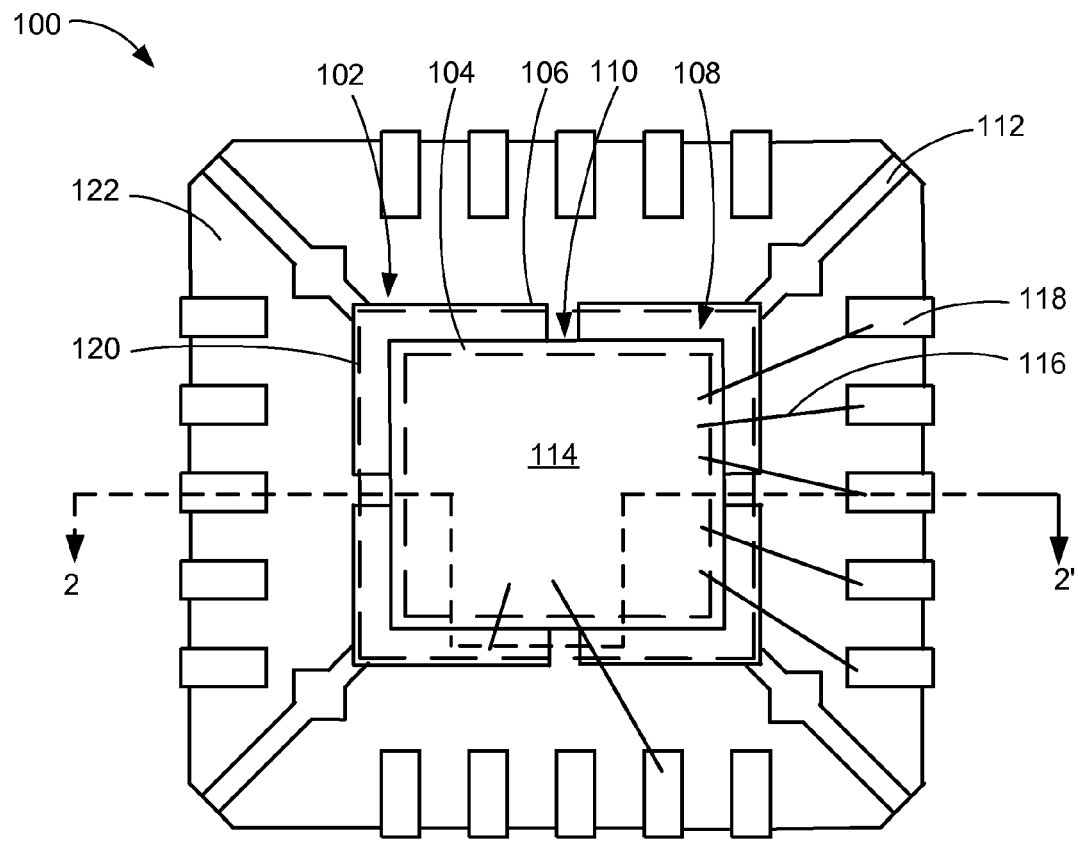
FIG. 1 is a plan view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure. The term "system" as used herein means and refers to the method and to the apparatus of the present invention in accordance with the context in which the term is used.

Referring now to FIG. 1, therein is shown a plan view of an integrated circuit package system 100 in an embodiment of the present invention. The integrated circuit package system 100 provides a high thermal performance management system with thermal flow paths to a top and a bottom of the integrated circuit package system 100. The integrated circuit package system 100 includes a paddle 102, such as a die-attach paddle.

The paddle 102 includes a recess 104 and a ring 106, such as a ground ring. The ring 106 surrounds the recess 104 and forms the peripheral outline of the paddle 102. The ring 106 has a plating 108, such as a silver (Ag) plating, for improving bondability with gold (Au) wires. The ring 106 has slots 110, such as trenches. Tie bars 112 may be connected to the paddle 102.

A device 114, such as an integrated circuit die, in the recess 104 and attaches on the paddle 102. Internal interconnects 116, such as bond wires, connect the device 114 with external interconnects 118, such as leads. The internal interconnects 116 may also connect to the ring 106 for ground connections removing restrictions for ground connections only to the external interconnects 118. A heat sink 120 is over the device 114 and the paddle 102 without impeding the connections of the internal interconnects 116.

An encapsulation 122, such as an epoxy mold compound (EMC), covers the paddle 102, the ring 106, the device 114, the internal interconnects 116, and the heat sink 120. The encapsulation 122 partially covers the external interconnects 118. For illustrative purposes, the heat sink 120 is described as covered by the encapsulation 122, although it is understood that the heat sink 120 may be exposed to ambient.

For illustrative purpose, the external interconnects 118 are shown in a single row, although it is understood that the number of rows may differ. Also for illustrative purpose, the external interconnects 118 as shown at the boundary of the integrated circuit package system 100, although it is understood that the configuration of the external interconnects 118 may be different, such as an array or mixed array configuration.

Figure 2:
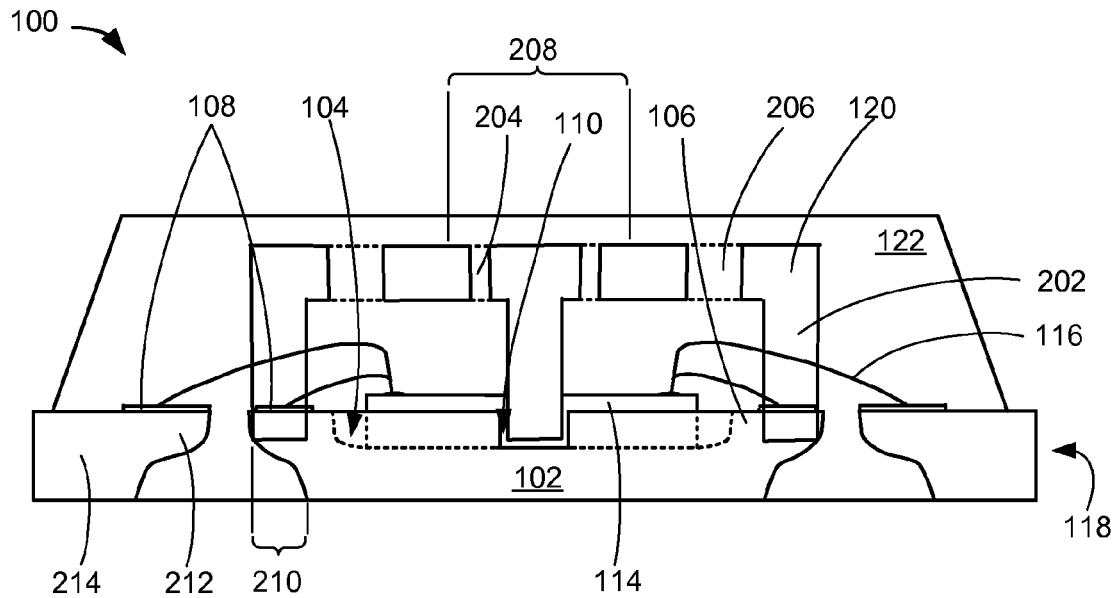
FIG. 2 is a cross-sectional view of the integrated circuit package system along a line segment 2-2' of FIG. 1.

Referring now to FIG. 2, therein is shown a cross-sectional view of the integrated circuit package system 100 along a line segment 2-2' of FIG. 1 in an embodiment of the present invention. The heat sink 120 has supports 202, such as posts, that fit into the slots 110. The heat sink 120 is over the device 114, wherein the device 114 is in the recess 104 of FIG. 1. First openings 204 and second openings 206 of the heat sink 120 are filled with the encapsulation 122. The first openings 204 are next to edges of the heat sink 120. The second openings 206 are near a central region 208 of the heat sink 120. For illustrative purposes, the heat sink 120 is shown having the first openings 204 and the second openings 206, although it is understood that the heat sink 120 may not have both types of openings or no openings. The internal interconnects 116 attach the device 114 to the plating 108 on the ring 106 and the plating 108 on the external interconnects 118.

The paddle 102 is exposed to ambient providing a thermal dissipation path from the device 114 to the exposed surface of the paddle 102. Heat may also dissipate from the device 114 through the supports 202 and the heat sink 120. Alternatively, heat may flow from the device 114 through the encapsulation 122 to the heat sink 120. These heat dissipation paths improve the thermal performance of the integrated circuit package system 100. For illustrative purposes, the paddle 102 is shown as exposed to ambient, although it is understood that the paddle 102 may not be exposed to ambient.

The exposed surface of the paddle 102 may be connected to ground of a next system level (not shown), such as a printed circuit board. This connection provides the ground connection sites at the plating 108 on the ring 106. This ground connection allows the paddle 102 to also function as an electromagnetic interference (EMI) shield. Also, through the connection of the paddle 102 to ground, the heat sink 120 is also connected to ground through its connection to the paddle 102. This allows the heat sink 120 to also function as an EMI shield.

The heat sink 120 and the paddle 102 form a mold lock feature. The first openings 204 and the second openings 206 in the heat sink 120 also serve as mold locks. A peripheral region 210 of the paddle 102 under the ring 106 is half etched forming another mold lock feature. Each of the external interconnects 118 has a lead tip 212 that is half etched of a lead body 214 forming yet another mold lock feature. For illustrative purposes, the heat sink 120 is described as covered by the encapsulation 122, although it is understood that the heat sink 120 may be exposed to ambient.

The plating 108 forms a weak adhesion with the encapsulation 122. The mold lock features help hold the encapsulation 122 and mitigate package delamination at this interface. The mold lock features also improve performance in moisture level sensitivity (MSL) test.

Figure 3:
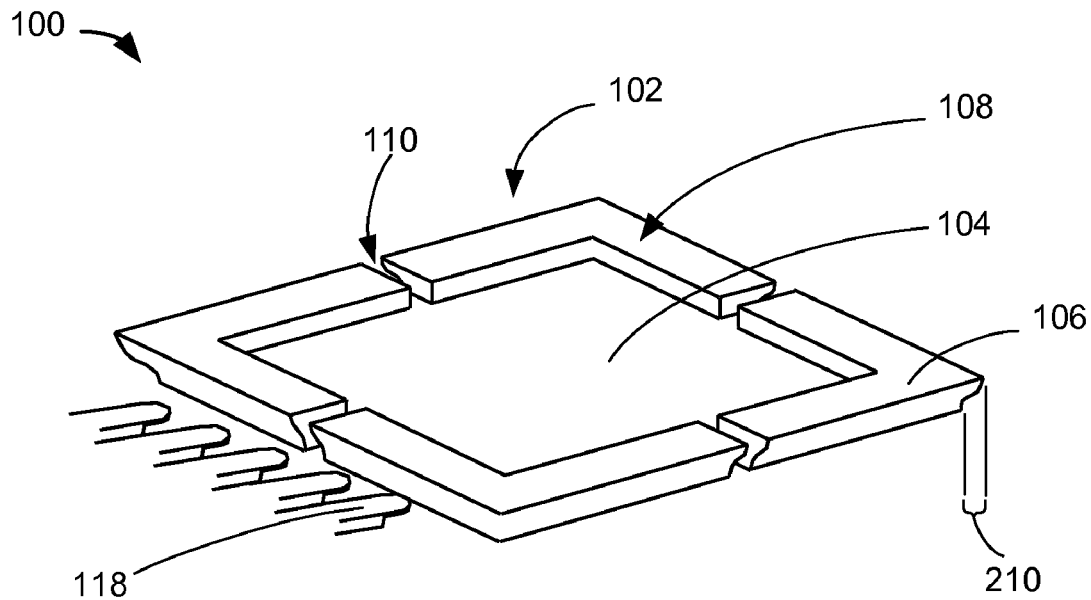
FIG. 3 is an isometric view of the integrated circuit package system of FIG. 2 in a slot formation phase.

Referring now to FIG. 3, therein is shown an isometric view of the integrated circuit package system 100 of FIG. 2 in a slot formation phase. The external interconnects 118 and the paddle 102 are formed from a lead frame (not shown). The peripheral region 210 of the paddle 102 is half etched under the ring 106. The recess 104 is half etched in a central region of the paddle 102 forming the ring 106 around the paddle 102. The slots 110 or trenches are formed in the paddle 102 and along the ring 106. The ring 106 has the plating 108 on its surface.

For illustrative purposes, the slots 110 are formed along each side of the paddle 102, although it is understood that the number and the locations of the slots 110 may differ. Also for illustrative purposes, the paddle 102 is described having the recess 104, although it is understood that the paddle 102 may not have the recess 104 and the ring 106.

Figure 4:
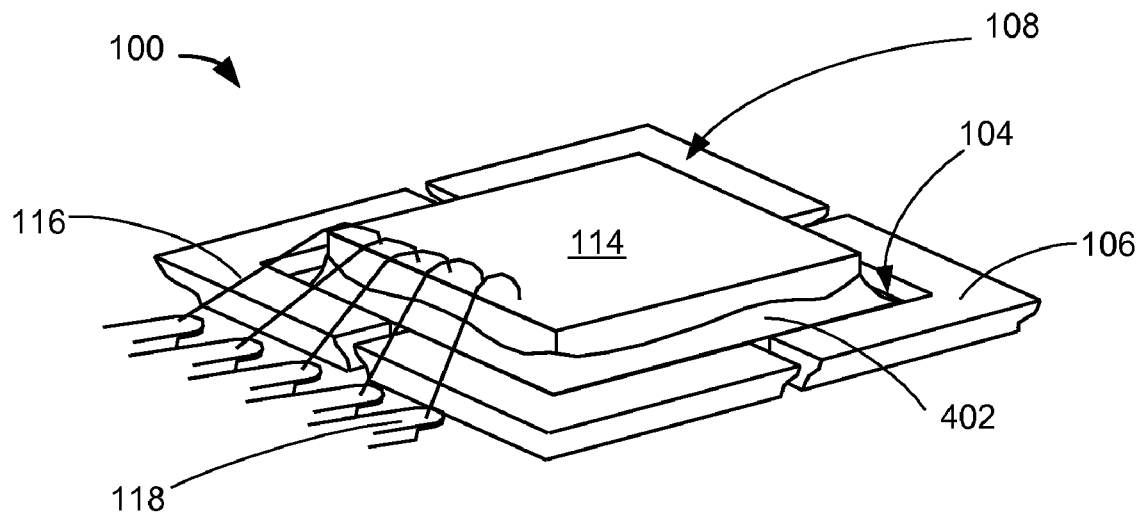
FIG. 4 is the structure of FIG. 3 in a device mount phase.

Referring now to FIG. 4, therein is shown the structure of FIG. 3 in a device mount phase. The device 114 is mounted on the recess 104 with an adhesive 402, such as a die-attach adhesive or a thermal adhesive. Edges of the device 114 do not contact the ring 106 with a predetermined clearance. The recess 104 controls the bleeding of the adhesive 402 preventing contamination of the plating 108 on the ring 106. The internal interconnects 116 are attached between the device 114 and the external interconnects 118 or the ring 106.

Figure 5:
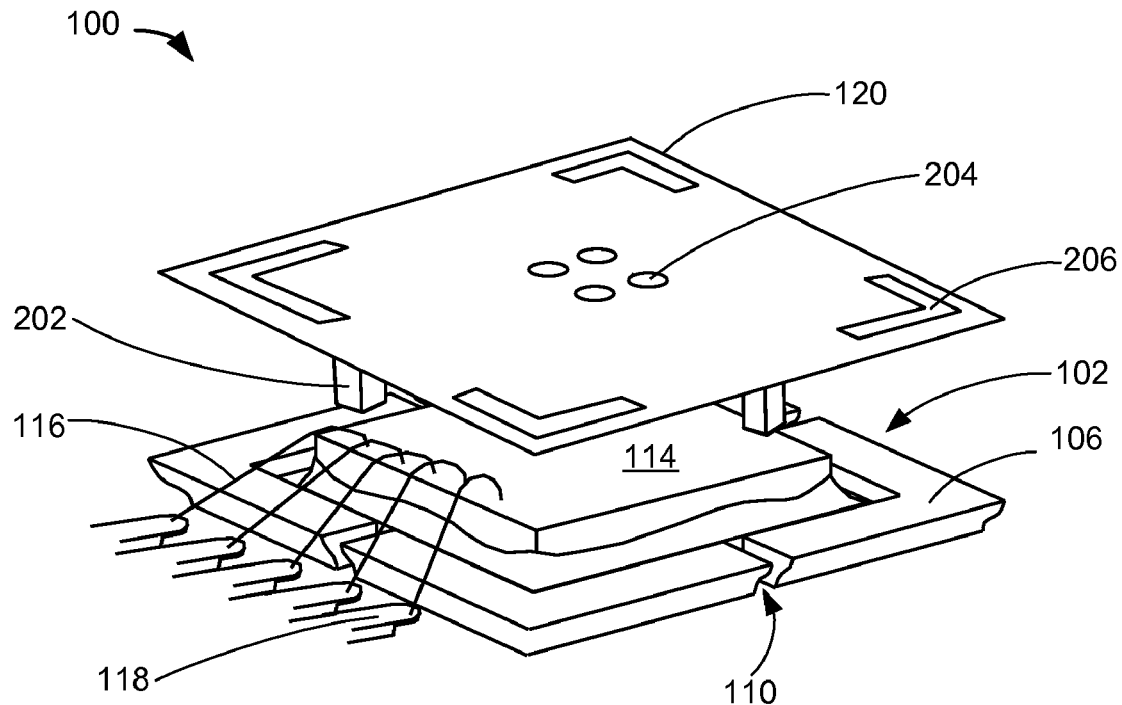
FIG. 5 is the structure of FIG. 4 in an alignment phase.

Referring now to FIG. 5, therein is shown the structure of FIG. 4 in an alignment phase. The heat sink 120 may be moved into position by a standalone equipment (not shown) or part of the molding equipment (not shown). For example, the heat sink 120 may be moved into position in a matrix using a multi-picker equipment or individually with a pick and place equipment. The heat sink 120 is aligned with the supports 202 over the slots 110, wherein a pattern of the supports 202 complement a pattern of the slots 110 in the ring 106. The supports 202 do not contact the device 114, the paddle 102, the external interconnects 118, and the internal interconnects 116. The first openings 204 and the second openings 206 in the heat sink 120 provides channels for the flow of a molding compound (not shown).

Figure 6:
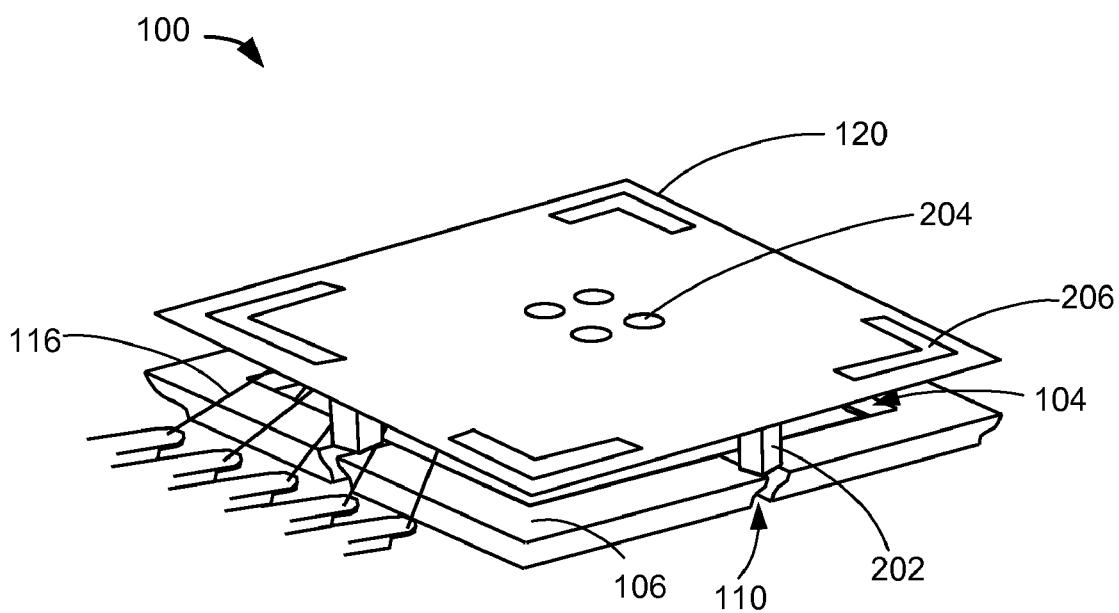
FIG. 6 is the structure of FIG. 5 in a sink mount phase.

Referring now to FIG. 6, therein is shown the structure of FIG. 5 in a sink mount phase. The complementary patterns between the supports 202 and the slots 110 have a predetermined tolerance. This ensures interlocks between the supports 202 and the slots 110 without requiring expensive precision equipments. An optional epoxy, such as a fast cure epoxy or a snap cure epoxy, may be dispensed securing the heat sink 120 in the slots 110. The epoxy may be cured at a mold lead frame preheat station or at a mold preheat area.

The depth of the recess 104 and the thickness of the device 114 of FIG. 5 provide a predetermine space for the wire loops of the internal interconnects 116 preventing contact with the heat sink 120. The connection location of the internal interconnects 116 prevents the wire loops from contacting the supports 202.

The first openings 204 are over a central region of the device 114 avoiding a flow of a molding compound (not shown) that may cause breakage or adverse wire sweeps of the internal interconnects 116. The second openings 206 parallel the sides of the ring 106 also to avoid a flow of the molding compound that may cause breakage or adverse wire sweeps of the internal interconnects 116. The second openings 206 provide a predetermined distance from the supports 202 reducing structural stress regions of the heat sink 120.

Figure 7:
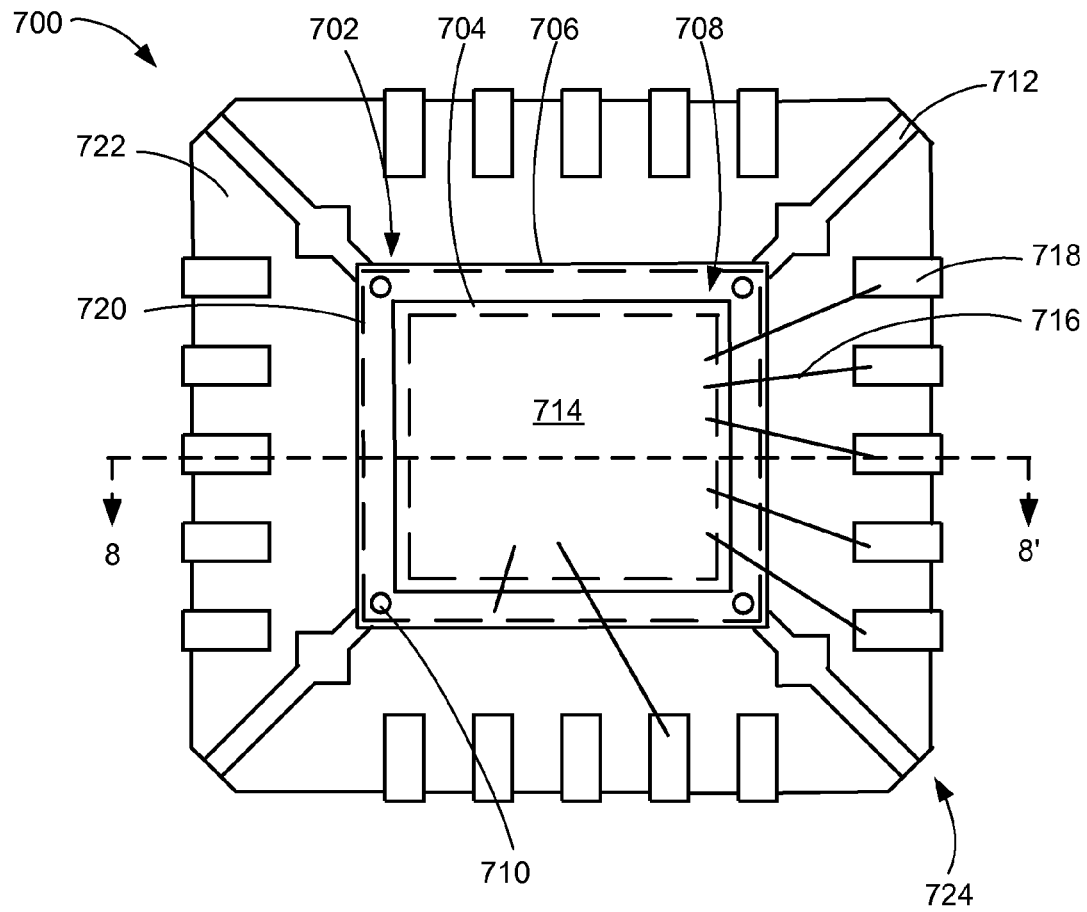
FIG. 7 is a plan view of an integrated circuit package system in an alternative embodiment of the present invention.

Referring now to FIG. 7, therein is shown a plan view of an integrated circuit package system 700 in an embodiment of the present invention. The integrated circuit package system 700 provides a high thermal performance management system with thermal flow paths to a top and a bottom of the integrated circuit package system 700. The integrated circuit package system 700 includes a paddle 702, such as a die-attach paddle. Tie bars 712 may be connected to the paddle 702.

The paddle 702 includes a recess 704 and a ring 706, such as a ground ring. The ring 706 surrounds the recess 704 and forms the peripheral outline of the paddle 702. The ring 706 has a plating 708, such as a silver (Ag) plating, for improving bondability with gold (Au) wires. The ring 706 has slots 710, such as holes or through holes, at corners 724 of the ring 706.

A device 714, such as an integrated circuit die, is in the recess 704 and attaches on the paddle 702. Internal interconnects 716, such as bond wires, connect the device 714 with external interconnects 718, such as leads. The internal interconnects 716 may also connect to the ring 706 for ground connections removing restrictions for ground connections only to the external interconnects 718. A heat sink 720 is over the device 714 and the paddle 702 without impeding the connections of the internal interconnects 716.

An encapsulation 722, such as an epoxy mold compound (EMC), covers the paddle 702, the ring 706, the device 714, the internal interconnects 716, and the heat sink 720. The encapsulation 722 partially covers the external interconnects 718. For illustrative purposes, the heat sink 720 is described as covered by the encapsulation 722, although it is understood that the heat sink 720 may be exposed to ambient.

For illustrative purpose, the external interconnects 718 are shown in a single row, although it is understood that the number of rows may differ. Also for illustrative purpose, the external interconnects 718 as shown at the boundary of the integrated circuit package system 700, although it is understood that the configuration of the external interconnects 718 may be different, such as an array or mixed array configuration.

Figure 8:
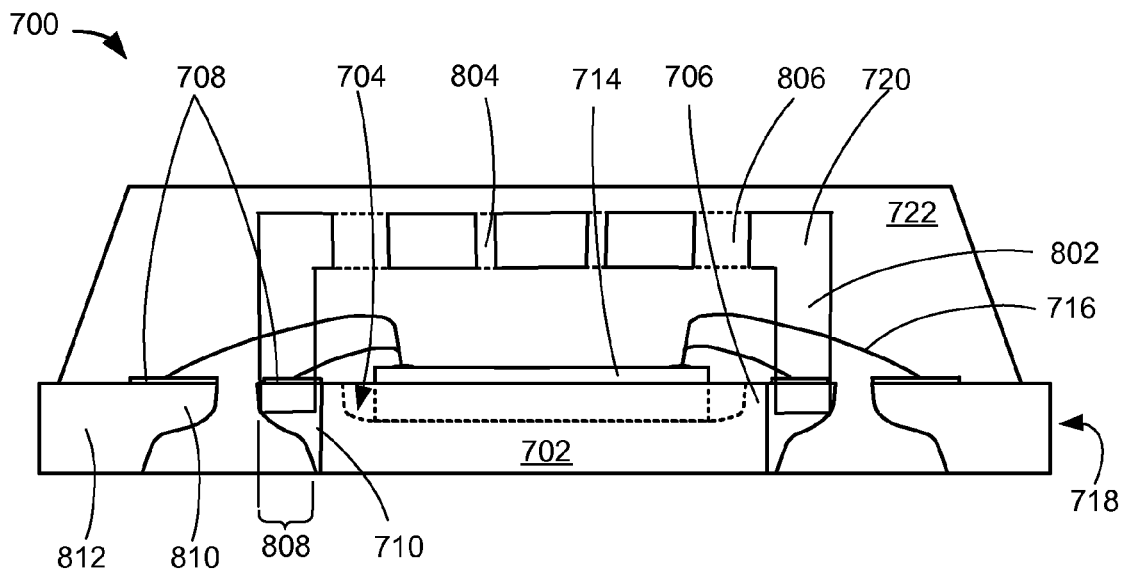
FIG. 8 is a cross-sectional view of an integrated circuit package system along a line segment 8-8' of FIG. 7.

Referring now to FIG. 8, therein is shown therein is shown a cross-sectional view of the integrated circuit package system 700 along a line segment 8-8' of FIG. 7 in an alternative embodiment of the present invention. The heat sink 720 has supports 802, such as posts, that fit into the slots 710. The heat sink 720 is over the device 714, wherein the device 714 is in the recess 704 of FIG. 7. First openings 804 and second openings 806 of the heat sink 720 are filled with the encapsulation 722. For illustrative purposes, the heat sink 720 is shown having the first openings 804 and the second openings 806, although it is understood that the heat sink 720 may not have both types of openings or no openings. The internal interconnects 716 attach the device 714 to the plating 708 on the ring 706 and the plating 708 on the external interconnects 718.

The paddle 702 is exposed to ambient providing a thermal dissipation path from the device 714 to the exposed surface of the paddle 702. Heat may also dissipate from the device 714 through the supports 802 and the heat sink 720. Alternatively, heat may flow from the device 714 through the encapsulation 722 to the heat sink 720. These heat dissipation paths improve the thermal performance of the integrated circuit package system 700. For illustrative purposes, the paddle 702 is shown as exposed to ambient, although it is understood that the paddle 702 may not be exposed to ambient.

The exposed surface of the paddle 702 may be connected to ground of a next system level (not shown), such as a printed circuit board. This connection provides the ground connection sites at the plating 708 on the ring 706. This ground connection allows the paddle 702 to also function as an electromagnetic interference (EMI) shield. Also, through the connection of the paddle 702 to ground, the heat sink 720 is also connected to ground through its connection to the paddle 702. This allows the heat sink 720 to also function as an EMI shield.

The heat sink 720 and the paddle 702 form a mold lock feature. The first openings 804 and the second openings 806 in the heat sink 720 also serve as mold locks. A peripheral region 808 of the paddle 702 under the ring 706 is half etched forming another mold lock feature. Each of the external interconnects 718 has a lead tip 810 that is half etched of a lead body 812 forming yet another mold lock feature. For illustrative purposes, the heat sink 720 is described as covered by the encapsulation 722, although it is understood that the heat sink 720 may be exposed to ambient.

The plating 708 forms a weak adhesion with the encapsulation 722. The mold lock features help hold the encapsulation 722 and mitigate package delamination at this interface. The mold lock features also improve performance in moisture level sensitivity (MSL) test.

Figure 9:
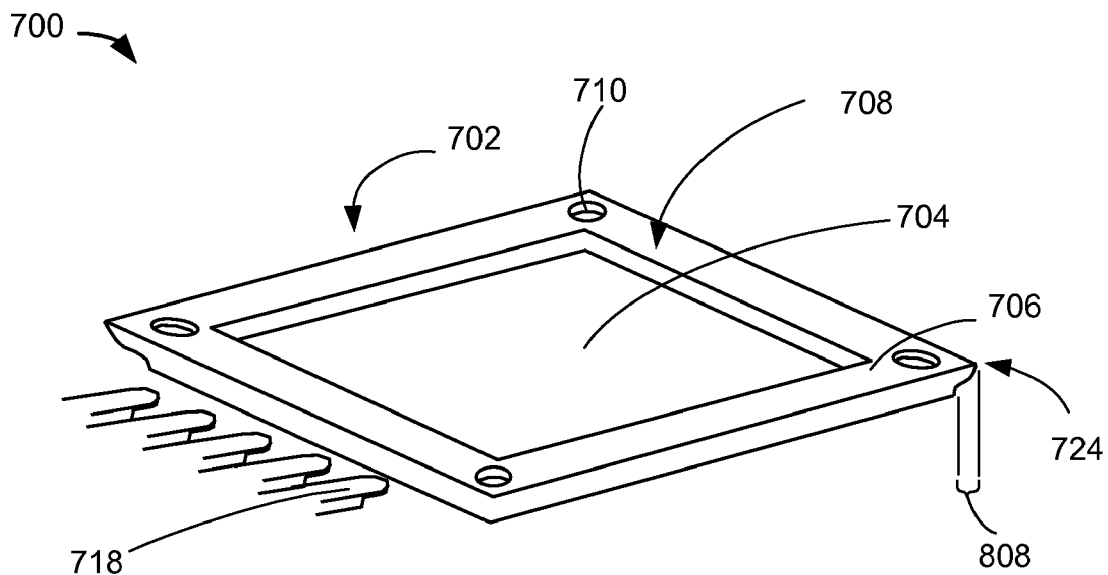
FIG. 9 is an isometric view of the integrated circuit package system of FIG. 7 in a slot formation phase.

Referring now to FIG. 9, therein is shown an isometric view of the integrated circuit package system 700 of FIG. 8 in a slot formation phase. The external interconnects 718 and the paddle 702 are formed from a lead frame (not shown). The peripheral region 808 of the paddle 702 is half etched under the ring 706. The recess 704 is half etched in a central region of the paddle 702 forming the ring 706 around the paddle 702. The slots 710 are formed at the corners 724 of the ring 706. The ring 706 has the plating 708 on its surface.

For illustrative purposes, the slots 710 are at the corners 724 of the paddle 702, although it is understood that the number and the locations of the slots 710 may differ. Also for illustrative purposes, the paddle 702 is described having the recess 704, although it is understood that the paddle 702 may not have the recess 704 and the ring 706.

Figure 10:
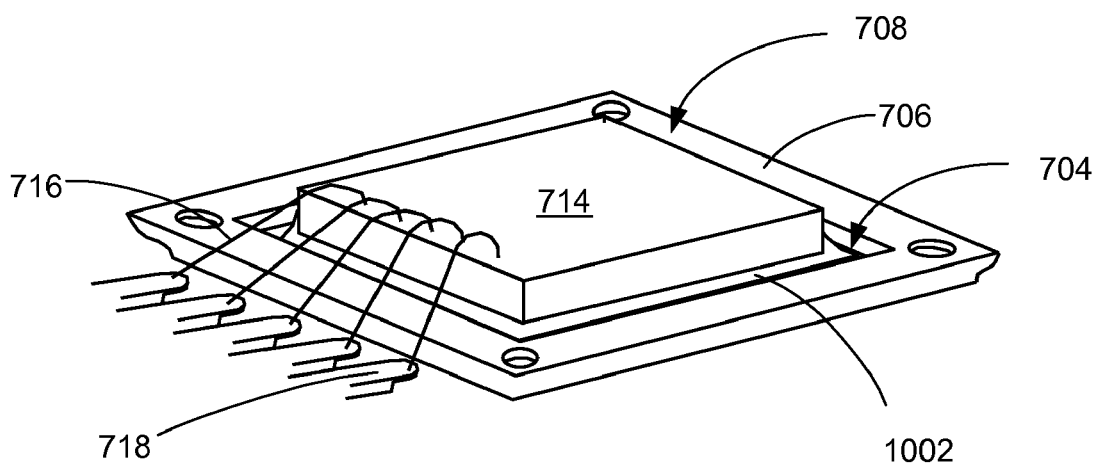
FIG. 10 is the structure of FIG. 8 in a device mount phase.

Referring now to FIG. 10, therein is shown the structure of FIG. 9 in a device mount phase. The device 714 is mounted on the recess 704 with an adhesive 1002, such as a die-attach adhesive or a thermal adhesive. Edges of the device 714 do not contact the ring 706 with a predetermined clearance. The recess 704 controls the bleeding of the adhesive 1002 preventing contamination of the plating 708 on the ring 706. The internal interconnects 716 are attached between the device 714 and the external interconnects 718 or the ring 706.

Figure 11:
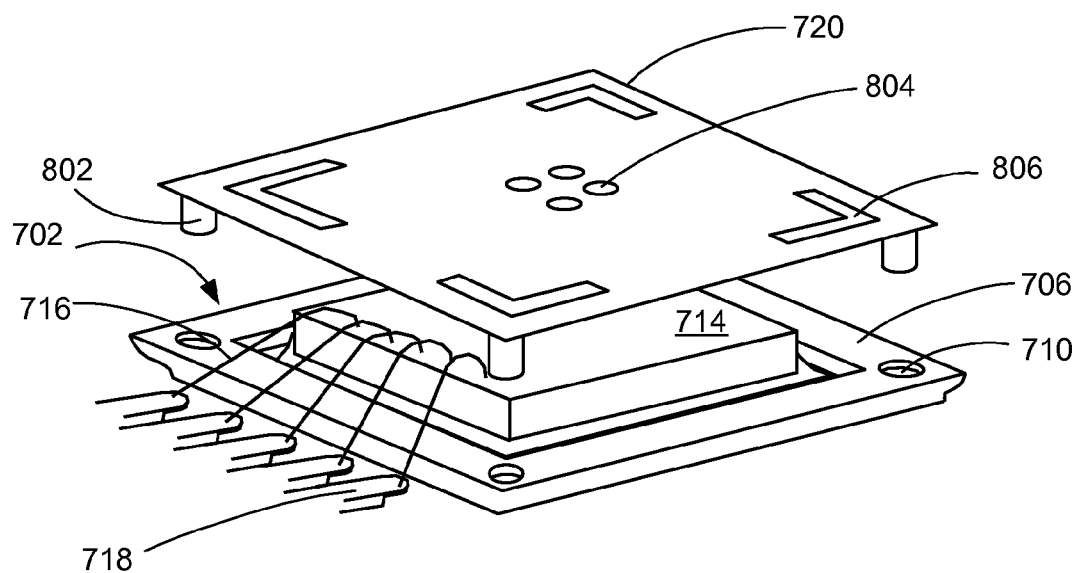
FIG. 11 is the structure of FIG. 9 in an alignment phase.

Referring now to FIG. 11, therein is shown the structure of FIG. 10 in an alignment phase. The heat sink 720 may be moved into position by a standalone equipment (not shown) or part of the molding equipment (not shown). For example, the heat sink 720 may be moved into position in a matrix using a multi-picker equipment or individually with a pick and place equipment. The heat sink 720 is aligned with the supports 802 over the slots 710, wherein a pattern of the supports 802 complement a pattern of the slots 710 in the ring 706. The supports 802 do not contact the device 714, the paddle 702, the external interconnects 718, and the internal interconnects 716. The first openings 804 and the second openings 806 in the heat sink 720 provides channels for the flow of a molding compound (not shown).

Figure 12:
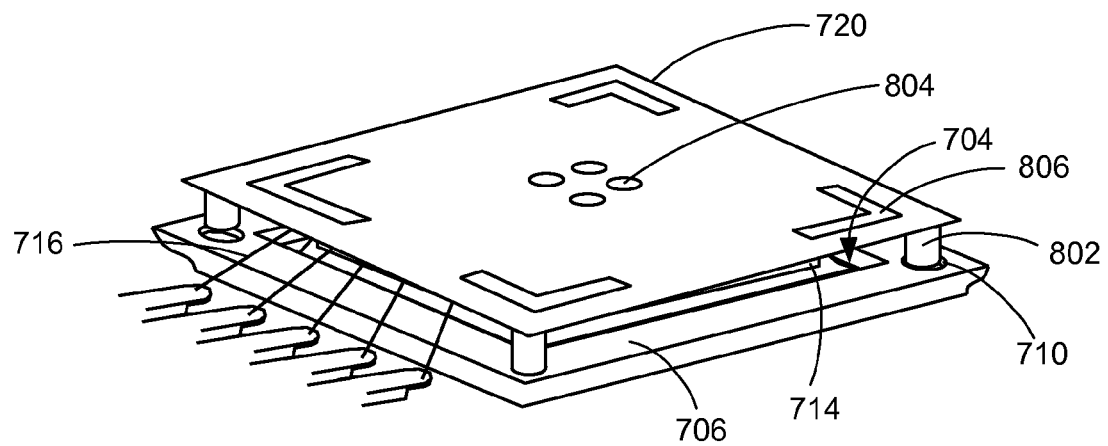
FIG. 12 is the structure of FIG. 10 in a spreader mount phase.

Referring now to FIG. 12, therein is shown the structure of FIG. 11 in a sink mount phase. The complementary patterns between the supports 802 and the slots 710 have a predetermined tolerance. This ensures interlocks between the supports 802 and the slots 710 without requiring expensive precision equipments. An optional epoxy, such as a fast cure epoxy or a snap cure epoxy, may be dispensed securing the heat sink 720 in the slots 710. The epoxy may be cured at a mold lead frame preheat station or at a mold preheat area.

The depth of the recess 704 and the thickness of the device 714 provide a predetermine space for the wire loops of the internal interconnects 716 preventing contact with the heat sink 720. The connection location of the internal interconnects 716 prevents the wire loops from contacting the supports 802.

The first openings 804 are over a central region of the device 714 avoiding a flow of a molding compound (not shown) that may cause breakage or adverse wire sweeps of the internal interconnects 716. The second openings 806 parallel the sides of the ring 706 also to avoid a flow of the molding compound that may cause breakage or adverse wire sweeps of the internal interconnects 716. The second openings 806 provide a predetermined distance from the supports 802 and each other reducing structural stress regions of the heat sink 720.

Figure 13:
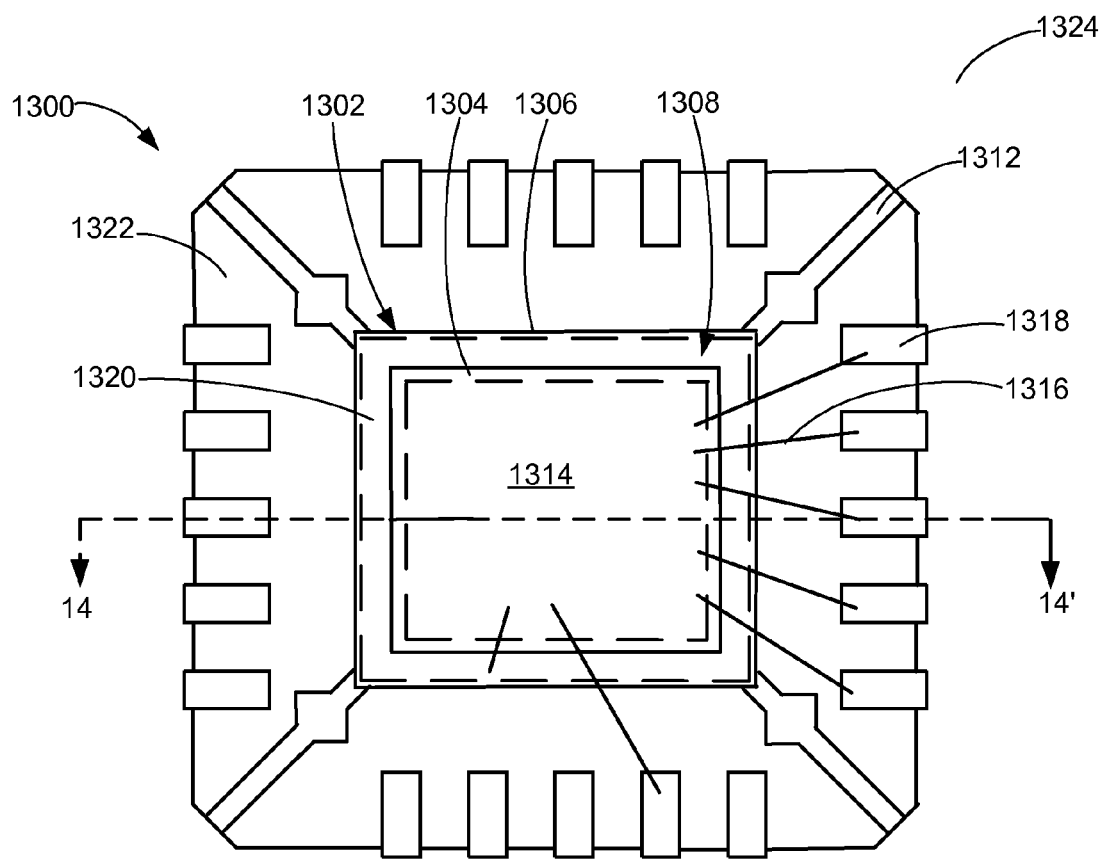
FIG. 13 is a plan view of an integrated circuit package system in another alternative embodiment of the present invention.

Referring now to FIG. 13, therein is shown a plan view of an integrated circuit package system 1300 in another alternative embodiment of the present invention. The integrated circuit package system 1300 provides a high thermal performance management system with thermal flow paths to a top and a bottom of the integrated circuit package system 1300. The integrated circuit package system 1300 includes a paddle 1302, such as a die-attach paddle.

The paddle 1302 includes a recess 1304 and a ring 1306, such as a ground ring. The ring 1306 surrounds the recess 1304 and forms the peripheral outline of the paddle 1302. The ring 1306 has a plating 1308, such as a silver (Ag) plating, for improving bondability with gold (Au) wires. Tie bars 1312 having landing pads 1324, such as diamond shape pads, are connected to and have co-planar surfaces with the paddle 1302.

A device 1314, such as an integrated circuit die, in the recess 1304 and attaches on the paddle 1302. Internal interconnects 1316, such as bond wires, connect the device 1314 with external interconnects 1318, such as leads. The internal interconnects 1316 may also connect to the ring 1306 for ground connections removing restrictions for ground connections only to the external interconnects 1318. A heat sink 1320 is over the device 1314 and the paddle 1302 without impeding the connections of the internal interconnects 1316.

An encapsulation 1322, such as an epoxy mold compound (EMC), covers the paddle 1302, the ring 1306, the device 1314, the internal interconnects 1316, and the heat sink 1320. The encapsulation 1322 partially covers the external interconnects 1318. For illustrative purposes, the heat sink 1320 is described as covered by the encapsulation 1322, although it is understood that the heat sink 1320 may be exposed to ambient.

For illustrative purpose, the external interconnects 1318 are shown in a single row, although it is understood that the number of rows may differ. Also for illustrative purpose, the external interconnects 1318 as shown at the boundary of the integrated circuit package system 1300, although it is understood that the configuration of the external interconnects 1318 may be different, such as an array or mixed array configuration.

Figure 14:
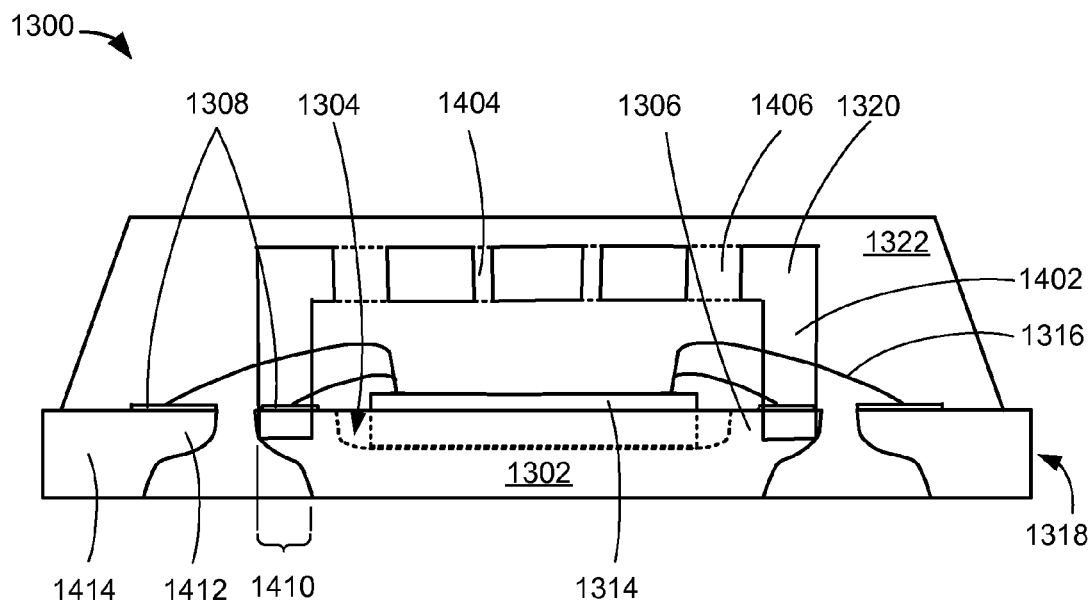
FIG. 14 is a cross-sectional view of the integrated circuit package system along a line segment 14-14' of FIG. 13.

Referring now to FIG. 14, therein is shown a cross-sectional view of the integrated circuit package system 1300 along a line segment 14-14' of FIG. 13 in another alternative embodiment of the present invention. The heat sink 1320 has supports 1402, such as posts, on the tie bars 1312 of FIG. 13. The heat sink 1320 is over the device 1314, wherein the device 1314 is in the recess 1304. First openings 1404 and second openings 1406 of the heat sink 1320 are filled with the encapsulation 1322. For illustrative purposes, the heat sink 1320 is shown having the first openings 1404 and the second openings 1406, although it is understood that the heat sink 1320 may not have both types of openings or no openings. The internal interconnects 1316 attach the device 1314 to the plating 1308 on the ring 1306 and the plating 1308 on the external interconnects 1318.

The paddle 1302 is exposed to ambient providing a thermal dissipation path from the device 1314 to the exposed surface of the paddle 1302. Heat may also dissipate from the device 1314 through the supports 1402 and the heat sink 1320. Alternatively, heat may flow from the device 1314 through the encapsulation 1322 to the heat sink 1320. These heat dissipation paths improve the thermal performance of the integrated circuit package system 1300. For illustrative purposes, the paddle 1302 is shown as exposed to ambient, although it is understood that the paddle 1302 may not be exposed to ambient.

The exposed surface of the paddle 1302 may be connected to ground of a next system level (not shown), such as a printed circuit board. This connection provides the ground connection sites at the plating 1308 on the ring 1306. This ground connection allows the paddle 1302 to also function as an electromagnetic interference (EMI) shield. Also, through the connection of the paddle 1302 to ground, the heat sink 1320 is also connected to ground through its connection to the paddle 1302. This allows the heat sink 1320 to also function as an EMI shield.

The heat sink 1320 and the tie bars 1312 form a mold lock feature. The first openings 1404 and the second openings 1406 in the heat sink 1320 also serve as mold locks. A peripheral region 1410 of the paddle 1302 under the ring 1306 is half etched forming another mold lock feature. Each of the external interconnects 1318 has a lead tip 1412 that is half etched of a lead body 1414 forming yet another mold lock feature. For illustrative purposes, the heat sink 1320 is described as covered by the encapsulation 1322, although it is understood that the heat sink 1320 may be exposed to ambient.

The plating 1308 forms a weak adhesion with the encapsulation 1322. The mold lock features help hold the encapsulation 1322 and mitigate package delamination at this interface. The mold lock features also improve performance in moisture level sensitivity (MSL) test.

Figure 15:
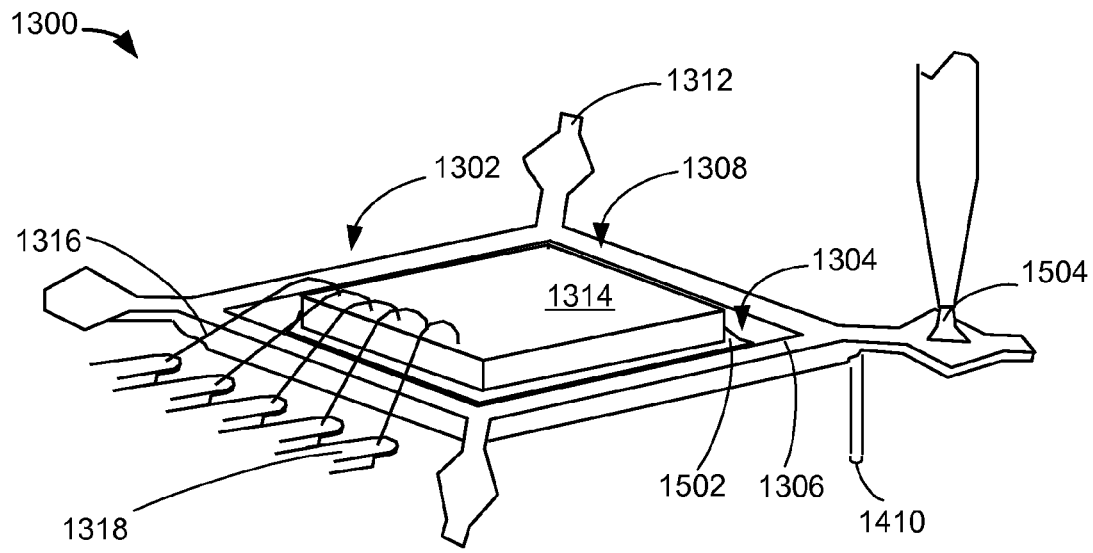
FIG. 15 is an isometric view of the integrated circuit package system of FIG. 14 in a device mount phase.

Referring now to FIG. 15, therein is shown an isometric view of the integrated circuit package system 1300 of FIG. 13 in a device mount phase. The external interconnects 1318, the paddle 1302, and the tie bars 1312 are formed from a lead frame (not shown). The peripheral region 1410 of the paddle 1302 is half etched under the ring 1306. The recess 1304 is half etched in a central region of the paddle 1302 forming the ring 1306 around the paddle 1302. The ring 1306 has the plating 1308 on its surface.

For illustrative purposes, the tie bars 1312 are shown having landing pads 13324 extending more then than the rest of the tie bars 1312, although it is understood that the tie bars 1312 may not have extensions of the landing pads 13324 for providing the landing pad function. Also for illustrative purposes, the paddle 1302 is described having the recess 1304, although it is understood that the paddle 1302 may not have the recess 1304 and the ring 1306.

The device 1314 is mounted on the recess 1304 with an adhesive 1502, such as a die-attach adhesive or a thermal adhesive. Edges of the device 1314 do not contact the ring 1306 with a predetermined clearance. The recess 1304 controls the bleeding of the adhesive 1502 preventing contamination of the plating 1308 on the ring 1306. The internal interconnects 1316 are attached between the device 1314 and the external interconnects 1318 or the ring 1306. An epoxy 1504, such as a conductive epoxy, may be dispensed on the landing pads 1324 for securing the heat sink 1320 of FIG. 13.

Figure 16:
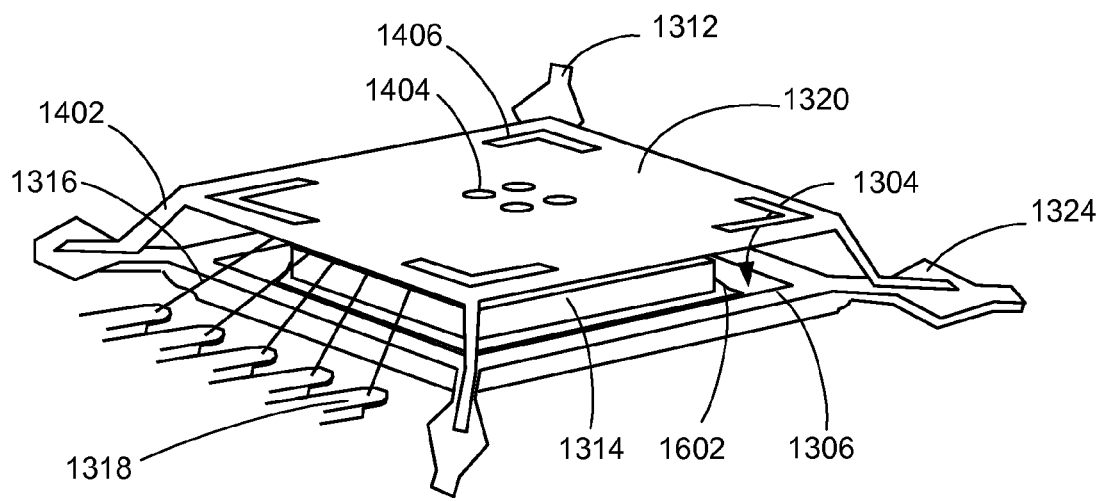
FIG. 16 is the structure of FIG. 15 in a sink mount phase.

Referring now to FIG. 16, therein is shown the structure of FIG. 15 in a sink mount phase. The heat sink 1320 may be moved into position by a standalone equipment (not shown) or part of the molding equipment (not shown). For example, the heat sink 1320 may be moved into position in a matrix using a multi-picker equipment or individually with a pick and place equipment. The heat sink 1320 is aligned with the landing pads 1324, wherein a pattern of the supports 1402 complement a pattern of the landing pads 1324 of the tie bars 1312.

The depth of the recess 1304 and the thickness of the device 1314 provide a predetermine space for the wire loops of the internal interconnects 1316 preventing contact with the heat sink 1320. The connection location of the internal interconnects 1316 prevents the wire loops from contacting the supports 1402.

The first openings 1404 and the second openings 1406 in the heat sink 1320 provides channels for the flow of a molding compound (not shown). The first openings 1404 are over a central region of the device 1314 avoiding a flow of a molding compound that may cause breakage or adverse wire sweeps of the internal interconnects 1316. The second openings 1406 parallel the sides of the ring 1306 also to avoid a flow of the molding compound that may cause breakage or adverse wire sweeps of the internal interconnects 1316.

Figure 17:
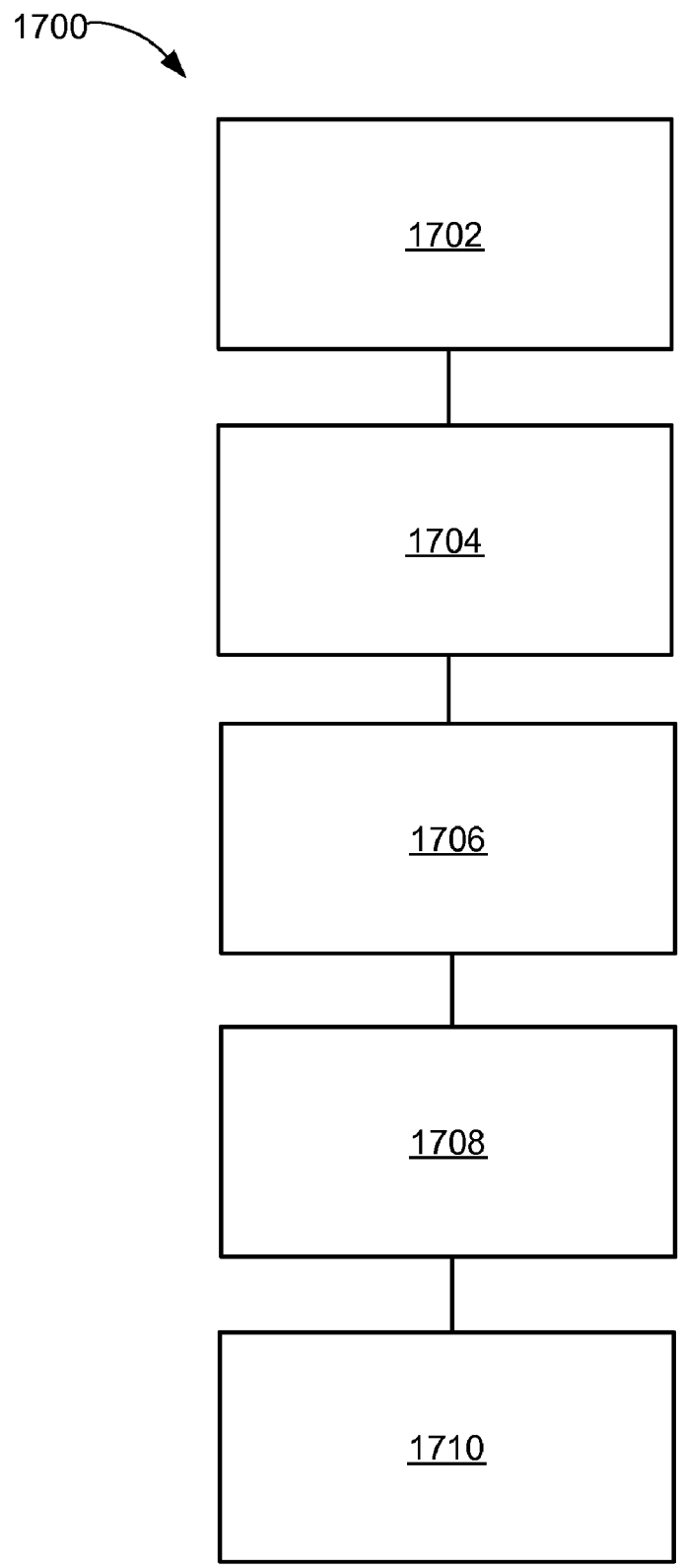
FIG. 17 is a flow chart of an integrated circuit package system for manufacture of the integrated circuit package system in an embodiment of the present invention.

Referring now to FIG. 17, therein is shown a flow chart of an integrated circuit package system 1700 for manufacture of the integrated circuit package system 100 in an embodiment of the present invention. The system 1700 includes forming a paddle in a block 1702; forming a ring with a recess in the paddle in a block 1704; mounting a device in the recess in a block 1706; forming a slot in the ring in a block 1708; and mounting a heat sink in the slot over the device in a block 1710.

It has been discovered that the present invention thus has numerous aspects.

A principle aspect that has been unexpectedly discovered is that the present invention provides an integrated circuit package system with improved thermal performance, improved moldability of a heat sink, and improved reliability performance. The heat sink provides heat dissipation paths to the top and bottom of the integrated circuit package system, thereby improving the thermal performance. The openings in the heat sink improve the moldability resulting in increased yield.

Another aspect is that the present invention provides complementary structures, such as trenches, holes, or through holes, in the die-attach paddle with the heat sink supports. The tolerance between the complementary structures provide interlocking features between the heat sink supports and the die-attach paddle without requiring expensive precision manufacturing equipment.

Yet another aspect of the present invention provides complementary structures, such as landing pads, in the tie bars with the heat sink supports.

Yet another aspect of the present invention provides a thermal management system providing heat dissipation paths from the top and the bottom of the integrated circuit die.

Yet another aspect of the present invention provides a recess in the die-attach paddle serving multiple functions. The recess serves to control bleeding of die-attach adhesive and provide height clearance for the heat sink.

Yet another aspect of the present invention provides openings on top of the heat sink. The openings mitigate wire sweeps.

Yet another aspect of the present invention is the ability to connect the heat sink to ground. This allows the heat sink to function as an EMI shield.

Yet another aspect of the present invention is the ability to connect the die-attach paddle to ground. This allows the die-attach paddle to function as an EMI shield.

Yet another aspect of the present invention provides an EMI shield enclosure with both the heat sink and die-attach paddle connected to ground.

Yet another aspect of the present invention provides multiple mold lock features improving performance on moisture level sensitivity (MSL) test and reliability. The mold lock features mitigate or prevent package delamination.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

Thus, it has been discovered that the integrated circuit package system method of the present invention furnishes important and heretofore unknown and unavailable solutions, capabilities, and functional aspects for improving thermal performance, reducing EMI, and reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

What is claimed is:

1. An integrated circuit package system comprising:
   forming a paddle with a landing pad and external interconnects therearound, the paddle and the landing pad have co-planar surfaces;
   forming a recess in the paddle to form a ring around the paddle;
   mounting a device in the recess;
   forming a slot in the ring; and
   mounting a heat sink over the device to the landing pad or in the slot.

2. The system as claimed in claim 1 wherein forming the slot in the ring includes forming a trench in the ring.

3. The system as claimed in claim 1 wherein forming the slot in the ring includes forming a through hole in a corner of the ring.

4. The system as claimed in claim 1 further comprising molding encapsulation around the die through an opening in the heat sink.

5. The system as claimed in claim 1 wherein mounting the heat sink in the slot includes placing a support of the heat sink in the slot.

6. An integrated circuit package system comprising:
   forming a die-attach paddle with landing pads and external interconnects therearound, the paddle and the landing pads have co-planar surfaces;
   forming a recess in the die-attach paddle to form a ring, having a plating, around the die-attach paddle;
   mounting an integrated circuit die connected to the plating and in the recess;
   forming a slot in the ring; and
   mounting a heat sink over the integrated circuit die to the landing pads or in the slot.

7. The system as claimed in claim 6 wherein forming the ring having the plating includes forming a silver plating on the ring.

8. The system as claimed in claim 6 further comprising coupling the die-attach paddle to a ground connection.

9. The system as claimed in claim 6 further comprising coupling the heat sink to a ground connection.

10. The system as claimed in claim 6 wherein mounting the heat sink in the slot includes placing a support on a side or a corner of the heat sink into the slot.

11. An integrated circuit package system comprising:
    a paddle with a landing pad, the paddle and the landing pad having co-planar surfaces, the paddle having a recess in the paddle to form a ring around the paddle, the ring having a slot therein;
    external interconnects around the paddle;
    a device in the recess; and
    a heat sink over the device mounted to the landing pad or in the slot.

12. The system as claimed in claim 11 wherein the slot in the ring is a trench in the ring.

13. The system as claimed in claim 11 wherein the slot in the ring is a through hole in a corner of the ring.

14. The system as claimed in claim 11 further comprising an encapsulation covering the device and in an opening in the heat sink.

15. The system as claimed in claim 11 wherein the heat sink has a support in the slot.

16. The system as claimed in claim 11 wherein:
    the paddle is a die-attach paddle;
    the device is an integrated circuit die in the recess; and
    further comprising:
    a plating on the ring.

17. The system as claimed in claim 16 wherein the plating on the ring is a silver plating.

18. The system as claimed in claim 16 further comprising the die-attach paddle connected to a ground connection.

19. The system as claimed in claim 16 further comprising the heat sink connected to a ground connection.

20. The system as claimed in claim 16 wherein the heat sink further includes a support on a side or a corner of the heat sink.

* * * * *